(12) United States Patent
Lin

(10) Patent No.: US 6,963,114 B2
(45) Date of Patent: Nov. 8, 2005

(54) SOI MOSFET WITH MULTI-SIDED SOURCE/DRAIN SILICIDE

(75) Inventor: Chun-Chieh Lin, Hsinchu (TW)

(73) Assignee: Taiwan Semiconductor Manufacturing Company, Ltd., Hsin-Chu (TW)

(*) Notice: Subject to any disclaimer, the term of this patent is extended or adjusted under 35 U.S.C. 154(b) by 25 days.

(21) Appl. No.: 10/749,273

(22) Filed: Dec. 29, 2003

(65) Prior Publication Data

US 2005/0145938 A1 Jul. 7, 2005

(51) Int. Cl.[7] .................. H01L 29/76; H01L 29/94
(52) U.S. Cl. ............... 257/382; 257/347; 257/383; 257/384
(58) Field of Search .................. 257/52, 57, 66, 257/72, 327, 382–384, 624–625, 344–347, 257/E21.438, E21.545, E21.561, E21.32, 257/E27.112

(56) References Cited

U.S. PATENT DOCUMENTS

| | | | | |
|---|---|---|---|---|
| 5,113,234 A | * | 5/1992 | Furuta et al. ............... | 257/384 |
| 6,040,589 A | * | 3/2000 | Zhang et al. ................. | 257/59 |
| 6,441,433 B1 | * | 8/2002 | En et al. ..................... | 257/344 |
| 6,518,631 B1 | * | 2/2003 | En et al. ..................... | 257/382 |
| 2001/0023090 A1 | * | 9/2001 | Lee ............................ | 438/149 |
| 2002/0014625 A1 | * | 2/2002 | Asami et al. ................. | 257/57 |
| 2004/0142579 A1 | * | 7/2004 | Morita et al. ............... | 438/785 |

FOREIGN PATENT DOCUMENTS

WO WO-02/082526 A1 * 10/2002 ......... H01L 21/316

OTHER PUBLICATIONS

Hillenius, S.J., "MOSFETs and Related Devices", Chapter 3 in "Modern Semiconductor Device Physics", ed. Sze, S.M., John Wiley & Sons, New York 1998 (ISBN: 0-471-15237-4) (pp. 160-161).*

* cited by examiner

Primary Examiner—Nathan J. Flynn
Assistant Examiner—Johannes Mondt
(74) Attorney, Agent, or Firm—Haynes and Boone, LLP

(57) ABSTRACT

A microelectronic device including an insulator located over a substrate, a semiconductor feature and a contact layer. The semiconductor feature has a thickness over the insulator, a first surface opposite the insulator, and a sidewall spanning at least a portion of the thickness. The contact layer has a first member extending over at least a portion of the first surface and a second member spanning at least a portion of the sidewall.

58 Claims, 2 Drawing Sheets

SOI MOSFET WITH MULTI-SIDED SOURCE/DRAIN SILICIDE

BACKGROUND

The present disclosure relates generally to microelectronic devices and, more specifically, to a microelectronic device having a multi-sided source/drain silicide or other contact, a method of manufacture therefor, and an integrated circuit incorporating the same.

Transistors and other semiconductor devices typically include source and drain regions on opposing sides of a gate stack. Vias or other interconnects extend through one or more dielectric layers over the transistors, thereby contacting the source and drain regions to interconnect the transistors. Conventionally, the areas of the source and drain regions contacted by the vias include a silicide layer to decrease resistance between the vias and the source and drain regions.

However, as device scaling continues, the source and drain regions and the silicide contacts become progressively thinner. Consequently, the contact resistance at the junction between the vias and the source and drain regions becomes increasingly difficult to maintain within desired quantitative ranges.

Device scaling is also limited by the diameter of the vias and other interconnects extending through the interlevel dielectric layers of the interconnect structure. That is, while the feature size of active devices may be further decreased, a minimum contact area must be maintained for each source and drain region contacted by a via in order to decrease the contact resistance at the junction thereof and provide sufficient ohmic contact.

Accordingly, what is needed in the art is a device and method of manufacture thereof that addresses the above-discussed issues.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

Figure 1:
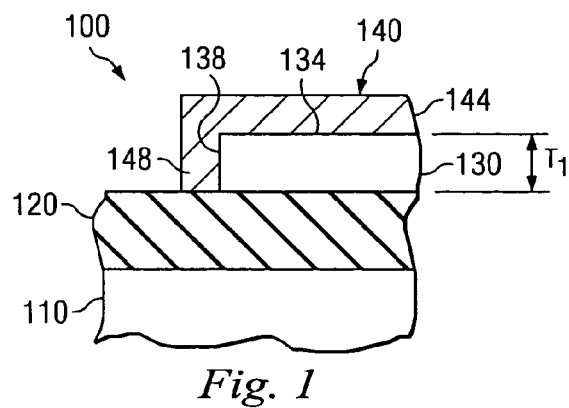
FIG. 1 illustrates a sectional view of one embodiment of a microelectronic device constructed according to aspects of the present disclosure.

It is to be understood that the following disclosure provides many different embodiments, or examples, for implementing different features of various embodiments. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact.

Referring to FIG. 1, illustrated is a sectional view of one embodiment of a microelectronic device 100 constructed according to aspects of the present disclosure. The microelectronic device 100 includes a substrate 110, an insulator 120 located over the substrate 110, a semiconductor feature 130 located over the insulator 120, and a contact layer 140 located over the semiconductor feature 130.

The substrate 110 may comprise an elementary semiconductor (such as crystal silicon, polycrystalline silicon, amorphous silicon and germanium), a compound semiconductor (such as silicon carbide and gallium arsenide), an alloy semiconductor (such as silicon germanium, gallium arsenide phosphide, aluminum indium arsenide, aluminum gallium arsenide and gallium indium phosphide), combinations thereof and/or other materials. The substrate 110 may also comprise a semiconductor material on an insulator, such as a silicon-on-insulator (SOI) substrate, a silicon on sapphire (SOS) substrate, or a thin film transistor (TFT). In one embodiment, the substrate 110 may also include a doped epitaxial layer. The substrate 110 may also include a multiple silicon structure or a multilayer, compound semiconductor structure.

The insulator 120 may be the insulator layer of the substrate 110 in embodiments in which the substrate 110 is an SOI substrate. In another embodiment, the insulator 120 may extend along a substantial portion of the substrate 110 (such as in wafer bonding). The insulator 120 may also be a buried oxide (BOX) layer, such as that formed by separation-by-implanted-oxygen (SIMOX) or wafer bonding. The SIMOX technology is based on ion-implanting a high-dose of oxygen ions into a silicon wafer, such that the peak concentration lies beneath the silicon surface. After implantation, the wafer is exposed to a high-temperature anneal (possibly ranging between about 1150° C. and about 1400° C.) to form a substantially continuous stoichiometric layer of silicon-dioxide. Such a BOX layer may electrically isolate top and bottom portions of the wafer. The thickness of the BOX may range between about 50 nm and about 500 nm. The layer of single-crystal silicon above the BOX may range between about 20 nm and about 500 nm.

Wafer bonding may employ mirror-polished, flat and clean wafers. When two wafers (one thermally-oxidized Si wafer and one bare Si wafer, for example) are brought into contact, they are locally attracted to each other by Van der Waals forces and bonded to each other. The bonding process may be initiated by locally applying a slight pressure to the wafer pair, and the bonded area spreads laterally over a substantial portion of the wafer area in a few seconds. Because the bonding achieved at room temperature may be relatively weak, wafer pairs bonded at room temperature may be exposed to a heat treatment to strengthen the bonding interface. After bonding, a substantial portion of the silicon from the Si wafers is removed, leaving a thinned layer of silicon. The IC devices are built in this remaining thinned silicon layer, which now exists over the oxide present at the interface of the bonded wafers.

The insulator 120 may also be formed over the substrate 110 by thermal oxidation, atomic layer deposition (ALD), chemical vapor deposition (CVD), physical vapor deposition (PVD) and/or other processes, and CMP and/or other methods may be employed to attain a desired thickness of the insulator 120. Moreover, although not limited by the scope of the present disclosure, the insulator 120 may comprise oxide, silicon oxide, silicon nitride, silicon oxynitride, hafnium oxide, zirconium oxide, aluminum oxide, a hafnium dioxide-alumina ($HfO_2$—$Al_2O_3$) alloy, combinations thereof and/or other materials. The insulator 120 may have a thickness ranging between about 5 Angstroms and about 100 Angstroms.

The semiconductor feature 130 may be defined from the silicon or other semiconductor layer of the substrate 110 in embodiments in which the substrate 110 is an SOI substrate. The semiconductor feature 130 may also be formed by depositing a semiconductor layer over the insulator 120, such as by ALD, CVD, PVD, metal induced lateral crystallization (MILC), epi, and/or other processes, and CMP and/or other methods may be employed to attain a desired thickness of the semiconductor layer. The semiconductor layer may be subsequently patterned, such as by wet and/or dry etching, to form the semiconductor feature 130. In embodiments in which the substrate 110 is a bulk semiconductor substrate and the insulator 120 is a buried oxide layer implanted in the substrate 110, the semiconductor feature 130 may be defined in the portion of the substrate 110 overlying the buried oxide layer and through which oxide was implanted to form the buried oxide layer.

The semiconductor feature 130 may comprise silicon, silicon germanium, silicon carbide, silicon carbon, silicon germanium carbide, silicon germanium carbon and/or other materials, and may have a thickness $T_1$ over the insulator 120 that is greater than or equal to about 400 Angstroms. In one embodiment, the thickness $T_1$ may be greater than or equal to about 100 Angstroms. The semiconductor feature 130 also has a first surface 134 opposite the insulator 120, and a sidewall 138 spanning at least a portion of the thickness $T_1$. In the embodiment shown in FIG. 1, the sidewall 138 substantially spans the thickness $T_1$. In one embodiment, the semiconductor feature 130 is a source/drain region of a metal-oxide-semiconductor field-effect-transistor (MOSFET) or other type of transistor. Accordingly, the semiconductor feature 130 may be doped with a p-type impurity (such as boron) and/or an n-type impurity (such as phosphorous).

The contact layer 140 has a first member 144 extending over at least a portion of the first surface 134 of the semiconductor feature 130. The contact layer 140 also has a second member 148 spanning at least a portion of the sidewall 138 of the semiconductor feature 130. In the embodiment shown in FIG. 1, the second member 148 substantially spans the sidewall 138, extending substantially uninterrupted between the first member 144 and the insulator 120. The contact layer 140 may comprise metal, metal silicide, metal nitride, metal oxide, cobalt silicide, nickel silicide, combinations thereof and/or other materials, and may be formed by ALD, CVD, PVD, PECVD, salicidation and/or other processes. In one embodiment, the contact layer 140 has a thickness of less than or equal to about 400 Angstroms.

Figure 2:
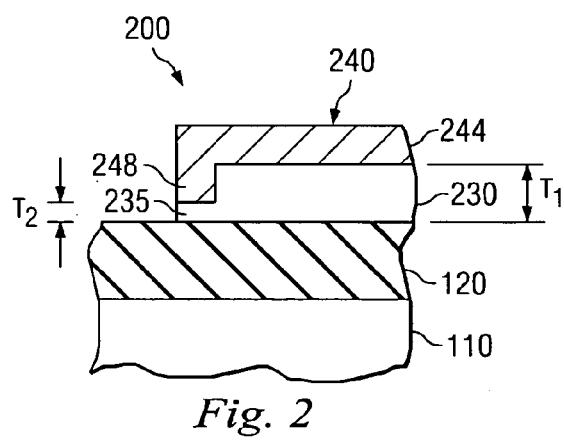
FIG. 2 illustrates a sectional view of another embodiment of a microelectronic device constructed according to aspects of the present disclosure.

Referring to FIG. 2, illustrated is a sectional view of another embodiment of the microelectronic device 100 shown in FIG. 1, herein designated by the reference numeral 200. The microelectronic device 200 includes a semiconductor feature 230 and a contact layer 240 having first and second members 244, 248 that are substantially similar in composition and manufacture to the semiconductor feature 130 and the contact layer 140 shown in FIG. 1. However, the second member 248 does not span the thickness $T_1$ of the semiconductor feature 230, as in the embodiment shown in FIG. 1. In contrast, the second member 248 is isolated from the insulator 120 by a portion 235 of the semiconductor feature 230. In one embodiment, the thickness $T_2$ of the semiconductor feature portion 235 is greater than or equal to about 50 Angstroms. The thickness $T_2$ that may also be less than about 100 Angstroms.

Figure 3:
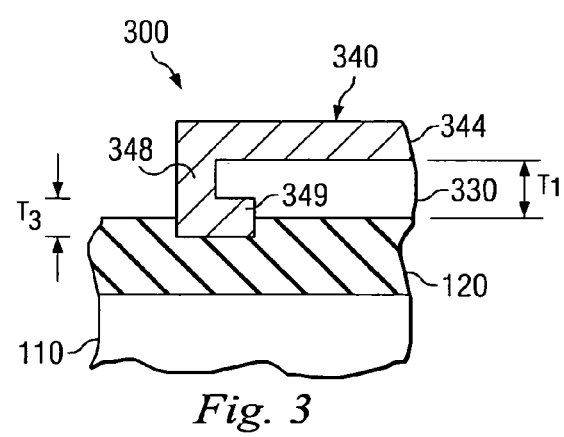
FIG. 3 illustrates a sectional view of another embodiment of a microelectronic device constructed according to aspects of the present disclosure.

Referring to FIG. 3, illustrated is a sectional view of another embodiment of the microelectronic device 100 shown in FIG. 1, herein designated by the reference numeral 300. The microelectronic device 300 includes a semiconductor feature 330 and a contact layer 340 having first and second members 344, 348 that are substantially similar in composition and manufacture to the semiconductor feature 130 and the contact layer 140 shown in FIG. 1. However, the contact layer 340 also includes a third member 349 interposing portions of the insulator 120 and the semiconductor feature 330. In one embodiment, the third member 349 of the contact layer 340 has a thickness $T_3$ that is greater than or equal to about 10 Angstroms.

Figure 4A:
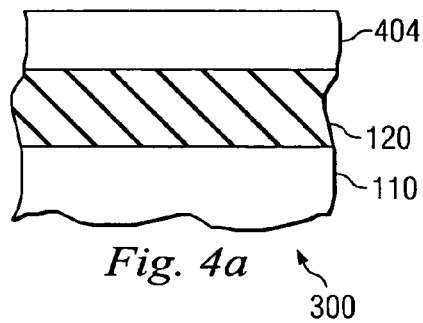
FIGS. 4a–d illustrate sectional views of embodiments of a portion of a method of manufacturing a microelectronic device according to aspects of the present disclosure.

Referring to FIG. 4a, illustrated is a sectional view of one embodiment of the microelectronic device 300 in an intermediate stage of manufacture according to aspects of the present disclosure. In FIG. 4a, a semiconductor layer 404 has been formed over the substrate 110 and the insulator 120. The semiconductor layer 404 may be a portion of Si isolated by a BOX layer using SIMOX. The semiconductor layer 404 may be formed by ALD, CVD, PVD, epi, MILC and/or other processes, possibly to a thickness ranging between about 100 Angstroms and about 2500 Angstroms.

Figure 4B:
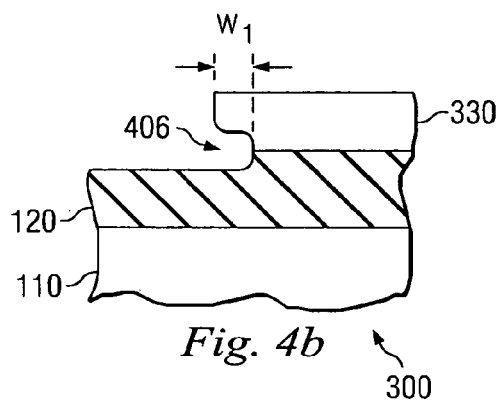
Figure 4C:
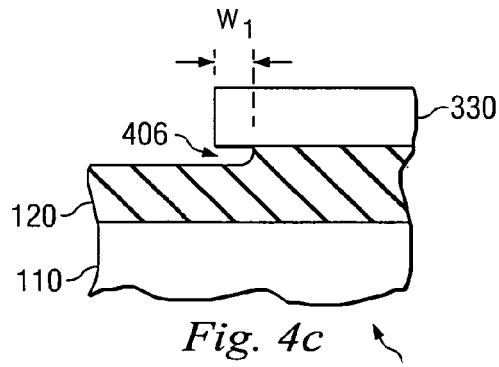

Referring to FIG. 4b and FIG. 4c, illustrated is a sectional view of the microelectronic device 300 shown in FIG. 4a in a subsequent stage of manufacture. In FIG. 4b and FIG. 4c, portions of the semiconductor layer 404 have been removed to form the semiconductor feature 330. For example, one or more dry and/or wet etching processes may be employed to pattern the semiconductor layer 404, thereby forming the semiconductor feature 330. In one embodiment, one or more of the etching processes may undercut a void 406 between the insulator 120 and the semiconductor feature 330. For example, the void 406 may be formed by an isotropic etch in which the rate of etching reaction is significant in more than one direction. Such an etch may undercut the insulator 120 and the semiconductor layer 404, as shown in FIG. 4b, or may undercut the insulator 120 but not the semiconductor layer 404, as shown in FIG. 4c.

That is, the void 406 may comprise a recess in the insulator 120 and the semiconductor layer 404, as shown in FIG. 4b, or may comprise a recess in the insulator 120 but not in the semiconductor layer 404, as shown in FIG. 4c. In embodiments in which the void 406 includes a recess in the insulator 120 and the semiconductor layer 404, as shown in FIG. 4b, the void 406 may not be centered on the interface between the insulator 120 and the semiconductor layer 404, such as if the etch forming the void 406 is more or less selective to the insulator 120 than the semiconductor layer 404.

In one embodiment, the width $W_1$ of the void 406 may range between about 10 Angstroms and about 1000 Angstroms. The width $W_1$ of the void 406 may also be substantially similar to the thickness of the third contact layer member 349 shown in FIG. 3.

Figure 4D:
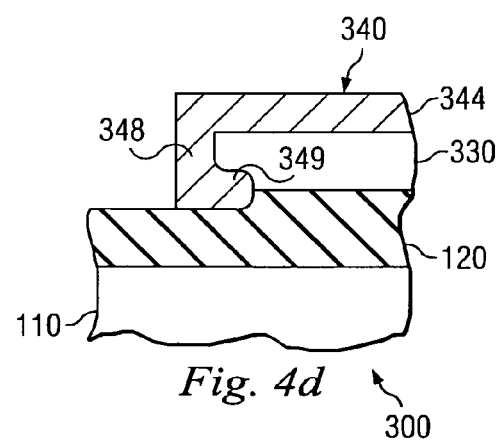

Referring to FIG. 4d, illustrated is a sectional view of the microelectronic device 300 shown in FIG. 4b and/or FIG. 4c in a subsequent stage of manufacture. In FIG. 4d, the contact layer 340 has been formed over the semiconductor feature 330, including in the void 406. The contact layer 340 may be formed by blanket deposition of a contact material, such as by ALD, CVD, PVD, salicidation and/or other processes. The deposition of the contact material may be by an isotropic process, such that the void 406 may be substantially filled. The contact material may then be etched or otherwise patterned to define the contact layer 340. As described above, the contact layer 340 may include first, second and third members 344, 348, 349.

Figure 5:
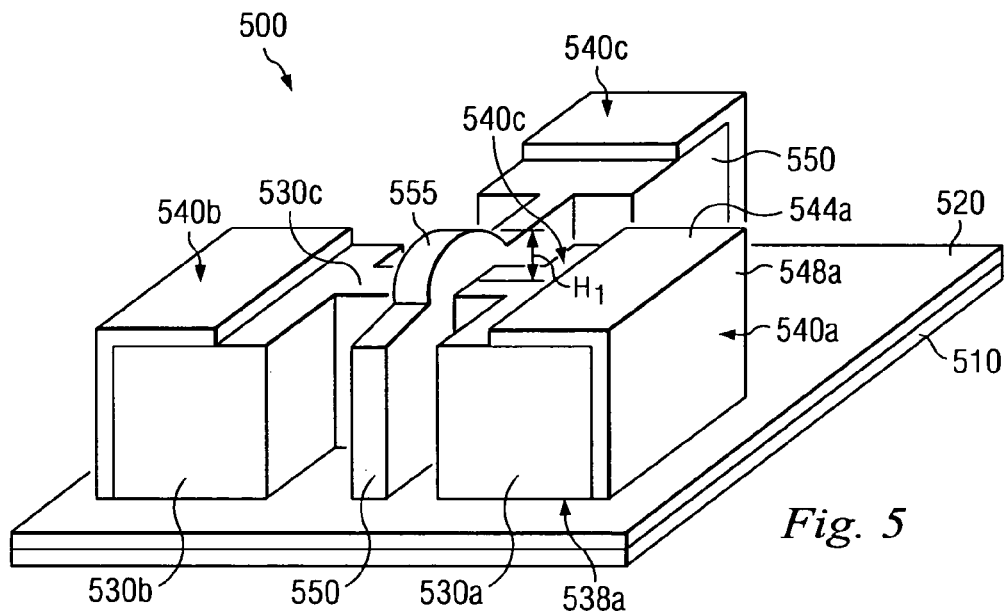
FIG. 5 illustrates a perspective view of another embodiment of a microelectronic device constructed according to aspects of the present disclosure.

Referring to FIG. 5, illustrated is a perspective view of one embodiment of a microelectronic device 500 constructed according to aspects of the present disclosure. In the illustrated embodiment, the microelectronic device 500 is a FinFET. Of course, aspects of the present disclosure are also applicable and/or readily adaptable to any type of transistor, including single-gate transistors, double-gate transistors, triple-gate transistors, and other multiple-gate transistors, and may be employed in a myriad of applications, including sensor cells, memory cells, logic cells and others.

The microelectronic device 500 includes an insulator 520 formed over or integral to a substrate 510. The microelectronic device 500 also includes first and second semiconductor features 530a, 530b. In one embodiment, the semiconductor features 530a, 530b are source/drain regions. The first and second semiconductor features 530a, 530b are connected by a third semiconductor feature 530c. For example, the third semiconductor feature 530c may be a channel region, possibly having a dopant type opposite a dopant type of the first and second semiconductor features 530a, 530b.

The microelectronic device 500 also includes first and second contacts 540a, 540b formed over corresponding ones of the semiconductor features 530a, 530b. The first and second contacts 540a, 540b may be substantially similar in composition and manufacture to the contact layer 140 shown in FIG. 1. For example, the first contact 540a may include first and second members 544a, 548a, the first member 544a extending over at least a portion of a surface 535a of the first semiconductor feature 530a, and the second member 548a spanning at least a portion of a sidewall 538a of the first semiconductor feature 530a. In the embodiment illustrated in FIG. 5, the second member 548a of the first contact 540a extends substantially uninterrupted between the first member 544a and the insulator 520, substantially spanning the sidewall 538a.

The microelectronic device 500 may also include a biasing feature 550 interposing the first and second semiconductor features 530a, 530b and spanning the third semiconductor feature 530c. In one embodiment, the biasing feature 550 may be a transistor gate. For example, the biasing feature 550 may comprise doped polysilicon and/or other conductive materials such as Ti, Ta, TiN, TaN, NiSi, and CoSi. The biasing feature 550 in the illustrated embodiment extends from at least partially between the first and second semiconductor features 530a, 530b, subsequently widening and terminating at a third contact 540c, which is substantially similar to the first and second contacts 540a, 540b. Moreover, as shown in FIG. 5, the biasing feature 550 may include a boss, wedge, fin or other type of protrusion 555 extending away from the semiconductor features 530a–c. For example, the protrusion 555 may extend to a height $H_1$ over the semiconductor features 530a–c. The microelectronic device 500 may also include a dielectric layer interposing the biasing feature 550 from one or more of the semiconductor features 530a–c.

Figure 6:
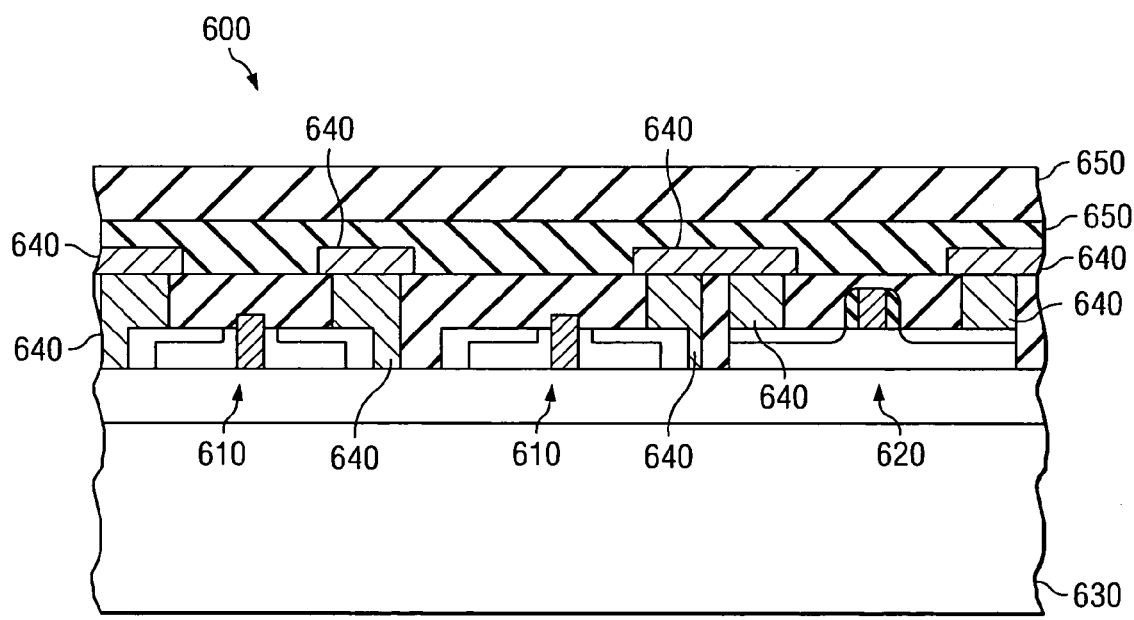
FIG. 6 illustrates a sectional view of one embodiment of an integrated circuit device constructed according to aspects of the present disclosure.

Referring to FIG. 6, illustrated is a sectional view of one embodiment of an integrated circuit device 600 constructed according to aspects of the present disclosure. The integrated circuit device 600 is one environment in which aspects of the above-described microelectronic devices may be implemented. For example, the integrated circuit device 600 includes a plurality of microelectronic devices 610 located on or in a substrate 630, one or more of which is substantially similar to one or more of the microelectronic devices 100, 200, 300, 500 shown in FIGS. 1–3 and 5, respectively. The microelectronic devices 610 may be interconnected and/or connected to one or more other microelectronic devices 620 manufactured on or in the substrate 630. The microelectronic devices 620 may be or comprise metal-oxide-semiconductor field-effect-transistor (MOSFET), FinFETs and/or other conventional or future-developed semiconductor devices.

The integrated circuit device 600 also includes interconnects 640 extending along and/or through one or more dielectric layers 650 to ones of the plurality of microelectronic devices 610. The dielectric layers 650 may comprise silicon dioxide, Black Diamond® and/or other materials, and may be formed by CVD, ALD, PVD, spin-on coating and/or other processes. The dielectric layers 650 may have a thickness ranging between about 2000 Angstroms and about 15,000 Angstroms. The interconnects 640 may comprise copper, tungsten, gold, aluminum, carbon nano-tubes, carbon fullerenes, a refractory metals and/or other materials, and may be formed by CVD, ALD, PVD and/or other processes.

Thus, the present disclosure introduces a microelectronic device including, in one embodiment, an insulator located over a substrate, a semiconductor feature and a contact layer. The semiconductor feature has a thickness over the insulator, a first surface opposite the insulator, and a sidewall spanning at least a portion the thickness. The contact layer has a first member extending over at least a portion of the first surface and a second member spanning at least a portion of the sidewall.

The present disclosure also provides a method of manufacturing a microelectronic device. In one embodiment, the method includes forming an insulator over a substrate and forming a semiconductor feature having a thickness over the insulator, the semiconductor feature further having a first surface opposite the insulator and a sidewall spanning at least a portion of the thickness. The method also includes forming a contact layer having a first member extending over at least a portion of the first surface and a second member spanning at least a portion of the sidewall.

A transistor device is also introduced in the present disclosure. In one embodiment, the transistor device includes an insulator located over a substrate, a gate located over the insulator, source and drain regions on opposing sides of the gate, and source and drain contacts. The source and drain regions have a thickness over the insulator, and each have a first surface opposite the insulator and a sidewall distal from the gate and spanning at least a portion of the thickness. The source and drain contacts each have a first member extending over at least a portion of a corresponding first surface and a second member spanning at least a portion of a corresponding sidewall.

The present disclosure also provides an integrated circuit device. In one embodiment, the integrated circuit device includes an insulator located over a substrate, a plurality of microelectronic devices, a plurality of dielectric layers located over the microelectronic devices, and a plurality of interconnects. Each of the microelectronic devices includes: (1) a semiconductor feature having a thickness over the insulator, a first surface opposite the insulator and a sidewall spanning at least a portion of the thickness; and (2) a contact layer having a first member extending over at least a portion of the first surface and a second member spanning at least a portion of the sidewall. The interconnects extend through ones of the dielectric layers, wherein at least one of the interconnects electrically couples ones of the microelectronic devices.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A microelectronic device, comprising:
   an insulator extending over at least a portion of a substrate;
   a semiconductor feature extending over at least a portion of the insulator; and
   a contact portion having a first portion, a second portion and a third portion, said first portion connecting said second portion and said third portion, wherein the first portion spans a sidewall of the semiconductor feature, and wherein a portion of the semiconductor feature interposes and contacts the second and third portions.

2. The device of claim 1 wherein the third portion interposes at least a portion of the insulator and at least a portion of the semiconductor feature.

3. The device of claim 2 wherein the third portion has a thickness of at least about 10 Angstroms.

4. The device of claim 1 wherein the contact layer comprises metal.

5. The device of claim 1 wherein the contact layer comprises metal silicide.

6. The device of claim 1 wherein the contact layer comprises cobalt silicide.

7. The device of claim 1 wherein the contact layer comprises nickel silicide.

8. The device of claim 1 wherein the contact layer comprises metal nitride.

9. The device of claim 1 wherein the contact layer comprises metal oxide.

10. The device of claim 1 wherein at least one of the first, second and third portions of the contact layer has a thickness of less than about 400 Angstroms.

11. The device of claim 1 wherein the semiconductor feature comprises silicon.

12. The device of claim 1 wherein the semiconductor feature comprises silicon and germanium.

13. The device of claim 1 wherein the semiconductor feature comprises silicon and carbon.

14. The device of claim 1 wherein the semiconductor feature comprises silicon, germanium and carbon.

15. The device of claim 1 wherein the semiconductor feature has a thickness of at least about 400 Angstroms.

16. The device of claim 1 wherein the semiconductor feature has a thickness of at least about 100 Angstroms.

17. The device of claim 1 wherein the insulator comprises an oxide.

18. The device of claim 1 wherein the insulator comprises silicon nitride.

19. The device of claim 1 wherein the insulator comprises silicon oxynitride.

20. The device of claim 1 wherein the insulator comprises a high-k dielectric material.

21. The device of claim 1 wherein the insulator comprises a buried oxide layer.

22. The device of claim 1 wherein the substrate is a silicon-on-insulator (SOI) substrate having an insulating layer interposing a semiconductor layer and a bulk substrate, the insulator is defined in the insulating layer, and the semiconductor feature is defined in the semiconductor layer.

23. A transistor device, comprising:
    an insulator located over a substrate;
    a gate located over the insulator;
    source and drain regions located over the insulator and on opposing sides of the gate; and
    source and drain contacts having a first portion, a second portion and a third portion, said first portion connecting said second portion and said third portion wherein the first portion spans a sidewall of a corresponding one of the source and drain regions, and wherein a portion of each of the source and drain regions interposes and contacts the second and third portions of the corresponding one of the source and drain contacts.

24. The device of claim 23 wherein the third portion of each of the source and drain contacts has a thickness of at least about 10 Angstroms.

25. The device of claim 23 wherein at least one of the source and drain contacts comprises metal.

26. The device of claim 23 wherein at least one of the source and drain contacts comprises metal silicide.

27. The device of claim 23 wherein at least one of the source and drain contacts comprises cobalt silicide.

28. The device of claim 23 wherein at least one of the source and drain contacts comprises nickel silicide.

29. The device of claim 23 wherein at least one of the source and drain contacts comprises metal nitride.

30. The device of claim 23 wherein at least one of the source and drain contacts comprises metal oxide.

31. The device of claim 23 wherein at least one of the first, second and third portions of at least one of the source and drain contacts has a thickness of less than about 400 Angstroms.

32. The device of claim 23 wherein at least one of the source and drain regions comprises silicon.

33. The device of claim 23 wherein at least one of the source and drain regions comprises silicon and germanium.

34. The device of claim 23 wherein at least one of the source and drain regions comprises silicon and carbon.

35. The device of claim 23 wherein at least one of the source and drain regions comprises silicon, germanium and carbon.

36. The device of claim 23 wherein at least one of the source and drain regions has a thickness of at least about 400 Angstroms.

37. The device of claim 23 wherein at least one of the source and drain regions has a thickness of at least about 100 Angstroms.

38. The device of claim 23 wherein the insulator comprises an oxide.

39. The device of claim 23 wherein the insulator comprises silicon nitride.

40. The device of claim 23 wherein the insulator comprises silicon oxynitride.

41. The device of claim 23 wherein the insulator comprises a high-k dielectric material.

42. The device of claim 23 wherein the insulator is comprise a buried oxide layer.

43. A method of manufacturing a microelectronic device, comprising:
- forming an insulator over a substrate;
- forming a semiconductor feature over at least a portion of the insulator; and
- forming a contact layer having a first portion, a second portion and a third portion, said first portion connecting said second portion and said third portion wherein the first portion spans a sidewall of the semiconductor feature, and wherein a portion of the semiconductor feature interposes and contacts the second and third portions.

44. The method of claim 43 wherein the third portion interposes at least a portion of the insulator and at least a portion of the semiconductor feature.

45. The method of claim 43 wherein the third portion interposes the semiconductor feature and the insulator and has a thickness of at least about 10 Angstroms.

46. An integrated circuit device, comprising:
- an insulator located over a substrate;
- a plurality of microelectronic devices each including:
  - a semiconductor feature located over the insulator; and
  - a contact layer having a first portion, a second portion and a third portion, said first portion connecting said second portion and said third portion
- wherein the first layer portion spans a sidewall of the semiconductor feature, and wherein
- a portion of the semiconductor feature interposes and contacts the second and third portions;
- a plurality of dielectric layers located over the plurality of microelectronic devices; and
- a plurality of interconnects each extending through ones of the plurality of dielectric layers, at least one of the plurality interconnects interconnecting ones of the plurality of microelectronic devices.

47. The integrated circuit device of claim 46 wherein the third portion of each of the plurality of microelectronic devices interposes the insulator and the semiconductor feature of the corresponding one of the plurality of microelectronic devices.

48. The integrated circuit device of claim 47 wherein the third contact layer portion of each of the plurality of microelectronic devices has a thickness of at least about 10 Angstroms.

49. The method of claim 43 wherein the contact layer has a composition selected from the group consisting of:
- metal;
- metal silicide;
- metal nitride; and
- metal oxide.

50. The method of claim 43 wherein the contact layer comprises a metal silicide selected from the group consisting of:
- cobalt silicide; and
- nickel silicide.

51. The method of claim 43 wherein the semiconductor feature has a composition selected from the group consisting of:
- a silicon composition;
- a silicon and germanium composition;
- a silicon and carbon composition; and
- a silicon, germanium and carbon composition.

52. The method of claim 43 wherein the insulator comprises at least one insulating material selected from the group consisting of:
- oxide;
- silicon nitride;
- silicon oxynitride; and
- high-k dielectric material.

53. The method of claim 43 wherein forming the insulator includes forming a buried oxide layer in the substrate.

54. The integrated circuit device of claim 46 wherein the contact layer of each of the plurality of microelectronic devices has a composition selected from the group consisting of:
- metal;
- metal silicide;
- metal nitride; and
- metal oxide.

55. The integrated circuit device of claim 46 wherein the contact layer of each of the plurality of microelectronic devices comprises a metal silicide selected from the group consisting of:
- cobalt silicide; and
- nickel silicide.

56. The integrated circuit device of claim 46 wherein the semiconductor feature of each of the plurality of microelectronic devices has a composition selected from the group consisting of:
- a silicon composition;
- a silicon and germanium composition;
- a silicon and carbon composition; and
- a silicon, germanium and carbon composition.

57. The integrated circuit device of claim 46 wherein the insulator comprises at least one insulating material selected from the group consisting of:
- oxide;
- silicon nitride;
- silicon oxynitride; and
- high-k dielectric material.

58. The integrated circuit device of claim 46 wherein the insulator is a buried oxide layer formed within the substrate.

* * * * *